US011205577B2

(12) United States Patent
Watanabe et al.

(10) Patent No.: US 11,205,577 B2
(45) Date of Patent: *Dec. 21, 2021

(54) METHOD OF SELECTIVELY ETCHING SILICON OXIDE FILM ON SUBSTRATE

(71) Applicant: TOKYO ELECTRON LIMITED, Tokyo (JP)

(72) Inventors: Hikaru Watanabe, Miyagi (JP); Akihiro Tsuji, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 27 days.

This patent is subject to a terminal disclaimer.

(21) Appl. No.: 15/905,213

(22) Filed: Feb. 26, 2018

(65) Prior Publication Data

US 2018/0190505 A1 Jul. 5, 2018

Related U.S. Application Data

(63) Continuation of application No. 15/046,871, filed on Feb. 18, 2016, now abandoned.

(30) Foreign Application Priority Data

Feb. 24, 2015 (JP) ................................ 2015-034144

(51) Int. Cl.
*H01L 21/311* (2006.01)
*H01L 21/768* (2006.01)

(52) U.S. Cl.
CPC .. *H01L 21/31116* (2013.01); *H01L 21/31144* (2013.01); *H01L 21/76807* (2013.01);
(Continued)

(58) Field of Classification Search
CPC ......... H01L 21/31116; H01L 21/76807; H01L 21/76808; H01L 21/76813; H01L 21/76897; H01L 21/31144
See application file for complete search history.

(56) References Cited

U.S. PATENT DOCUMENTS 4,412,119 A 10/1983 Komatsu et al.
5,286,344 A 2/1994 Blalock et al.
(Continued)

FOREIGN PATENT DOCUMENTS

EP 2 911 187 A1 8/2015
EP 2 963 677 A1 1/2016
(Continued)

*Primary Examiner* — Nilufa Rahim
*Assistant Examiner* — Scott E Bauman
(74) *Attorney, Agent, or Firm* — Rothwell, Figg, Ernst & Manbeck, P.C.

(57) ABSTRACT

An etching method including: (a) providing a workpiece including a first region made of a first material and a second region made of a second material defining a recess, the first region filling the recess of the second region while covering the second region; (b) generating plasma of a first fluorocarbon gas to etch the first region until before exposing the second region; (c) generating plasma of a second fluorocarbon gas to form fluorocarbon deposits on the first region; (d) generating plasma of an inert gas to etch the first region by fluorocarbon radicals contained in the fluorocarbon deposits; and (e) repeating step (c) and step (d) one or more times until after exposing the second region. An etching rate of the first material of the first region is higher than that of the second material of the second region with respect to the second fluorocarbon gas.

21 Claims, 13 Drawing Sheets

(52) U.S. Cl.
CPC .. *H01L 21/76808* (2013.01); *H01L 21/76813* (2013.01); *H01L 21/76897* (2013.01)

(56) References Cited

U.S. PATENT DOCUMENTS

| | | | |
|---|---|---|---|
| 5,880,037 A | 3/1999 | Arleo | |
| 6,074,959 A | 6/2000 | Wang et al. | |
| 6,168,726 B1 | 1/2001 | Li et al. | |
| 6,174,451 B1 * | 1/2001 | Hung | H01L 21/31116 216/67 |
| 6,211,092 B1 | 4/2001 | Tang et al. | |
| 6,239,011 B1 | 5/2001 | Chen et al. | |
| 6,337,285 B1 | 1/2002 | Ko | |
| 6,387,287 B1 | 5/2002 | Hung et al. | |
| 6,602,434 B1 | 8/2003 | Hung et al. | |
| 6,716,766 B2 | 4/2004 | Ko | |
| 6,797,189 B2 | 9/2004 | Hung et al. | |
| 6,803,318 B1 | 10/2004 | Qiao et al. | |
| 6,849,193 B2 | 2/2005 | Hung et al. | |
| 6,867,145 B2 | 3/2005 | Lee et al. | |
| 7,056,830 B2 | 6/2006 | Merry et al. | |
| 7,329,610 B2 | 2/2008 | Tsuchiya | |
| 7,708,859 B2 | 5/2010 | Huang et al. | |
| 9,257,300 B2 | 2/2016 | Bhowmick et al. | |
| 9,805,945 B2 | 10/2017 | Hidaka et al. | |
| 2001/0008226 A1 | 7/2001 | Hung et al. | |
| 2004/0038546 A1 * | 2/2004 | Ko | H01L 21/31116 438/710 |
| 2005/0048789 A1 * | 3/2005 | Merry | H01L 21/0332 438/723 |
| 2015/0325415 A1 * | 11/2015 | Watanabe | H01J 37/32532 216/67 |
| 2016/0005651 A1 * | 1/2016 | Watanabe | H01L 21/31116 438/702 |
| 2016/0211148 A1 * | 7/2016 | Watanabe | H01L 21/0212 |
| 2016/0211149 A1 | 7/2016 | Watanabe et al. | |
| 2016/0211150 A1 | 7/2016 | Watanabe et al. | |
| 2016/0379841 A1 * | 12/2016 | Hidaka | H01L 21/31116 438/714 |
| 2017/0011939 A1 * | 1/2017 | Tabata | H01L 21/76897 |

FOREIGN PATENT DOCUMENTS

| | | | |
|---|---|---|---|
| JP | H10-256232 A | | 9/1998 |
| JP | 2000058513 A | * | 2/2000 |
| JP | 2000-307001 A | | 11/2000 |
| KR | 10-2001-0079765 A | | 8/2001 |
| TW | 533502 B | | 5/2003 |

* cited by examiner

METHOD OF SELECTIVELY ETCHING SILICON OXIDE FILM ON SUBSTRATE

CROSS-REFERENCE TO RELATED APPLICATIONS

This application is a continuation of U.S. patent application Ser. No. 15/046,871, filed on Feb. 18, 2016, which claims priority from Japanese Patent Application No. 2015-034144, filed on Feb. 24, 2015, all of which are incorporated herein in their entireties by reference, and priority is claimed to each of the foregoing.

TECHNICAL FIELD

The present disclosure relates to an etching method, and particularly to a method of selectively etching a first region formed of silicon oxide, with respect to a second region formed of silicon nitride by a plasma processing on an object to be processed ("workpiece").

BACKGROUND

In manufacturing an electronic device, a processing of forming an opening such as a hole or a trench may be performed on a region formed of silicon oxide ($SiO_2$). In such a processing, as described in the specification of U.S. Pat. No. 7,708,859, in general, a workpiece is exposed to plasma of a fluorocarbon gas so that the region is etched.

A technology of selectively etching a first region formed of silicon oxide with respect to a second region formed of silicon nitride has been known. As an example of such a technology, a self-aligned contact (SAC) technology has been known. The SAC technology is described in Japanese Patent Laid-Open Publication No. 2000-307001.

A workpiece to be processed in the SAC technology includes a first region made of silicon oxide, a second region made of silicon nitride, and a mask. The second region is formed to define a recess, the first region is formed to fill the recess and cover the second region, and the mask is formed on the first region and provides an opening above the recess. In the conventional SAC technology, as described in Japanese Patent Laid-Open Publication No 2000-307001, plasma of a processing gas containing a fluorocarbon gas, an oxygen gas, and a rare gas is used in order to etch the first region. When the workpiece is exposed to the plasma of the processing gas, the first region is etched and an upper opening is formed in the portion exposed from the opening of the mask. When the workpiece is exposed to the plasma of the processing gas, the portion surrounded by the second region, that is, the first region within the recess is etched in a self-aligned manner. Accordingly, a lower opening continuous to the upper opening is formed in a self-aligned manner.

SUMMARY

The present disclosure provides an etching method including: (a) providing a workpiece including a first region made of a first material and a second region made of a second material defining a recess, the first region filling the recess of the second region while covering the second region; (b) generating plasma of a first fluorocarbon gas to etch the first region until before exposing the second region; (c) generating plasma of a second fluorocarbon gas to form fluorocarbon deposits on the first region; (d) generating plasma of an inert gas to etch the first region by fluorocarbon radicals contained in the fluorocarbon deposits; and (e) repeating step (c) and step (d) one or more times until after exposing the second region. An etching rate of the first material of the first region is higher than that of the second material of the second region with respect to the second fluorocarbon gas.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
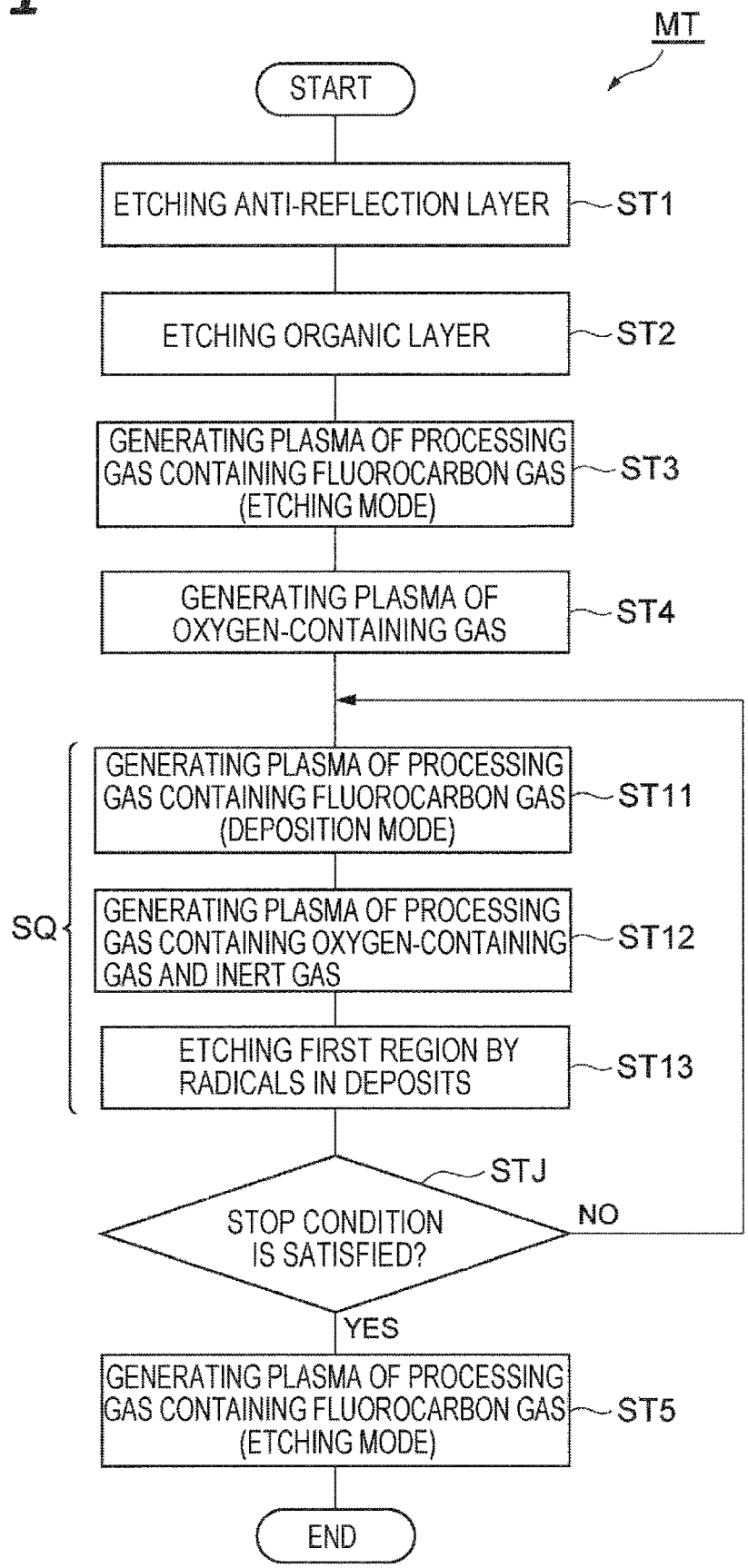
FIG. 1 is a flow chart illustrating an etching method according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the conventional technology described above, a state where a film for protecting the second region is not formed on the top surface of the second region may occur at a time of gradually etching the first region and exposing the second region. In the state, when the first region is etched, the second region is scraped. Thus, it is necessary to suppress the second region from being scraped when the second region is exposed. Further, in such a technology, it is necessary to shorten the time required from the start of the processing to the end.

That is, in the technology of selectively etching the first region formed of silicon oxide, it is required to suppress the second region formed of silicon nitride from being scraped, and to shorten the processing time.

According to one aspect, there is provided a method of selectively etching a first region formed of silicon oxide with respect to a second region formed of silicon nitride using a plasma processing on a workpiece. The workpiece includes the second region configured to define a recess, the first region formed to fill the recess and to cover the second region, and a mask formed on the first region, the mask providing an opening having a width wider than a width of the recess, above the recess. The method includes a sequence that is performed one or more times to etch the first region in a period including a time of exposing the second region, and a process of etching the first region by plasma of a second processing gas containing a fluorocarbon gas generated within a processing container after the sequence is performed one or more times. The sequence includes (a) a process of generating plasma of a first processing gas containing a fluorocarbon gas within the processing container that accommodates the workpiece in order to form deposits containing fluorocarbon on the workpiece, and (b) a process of etching the first region by radicals of the fluorocarbon included in the deposits. In one exemplary embodiment, in the process of generating the plasma of the second processing gas, the first region may be continuously etched to a bottom of the recess.

In the sequence of the method according to one aspect, deposits of fluorocarbon are formed on the workpiece when the second region is exposed, and then the first region is etched by the radicals in the deposits. By the sequence SQ, although the etching rate is low, the first region is etched, and the second region is suppressed from being scraped when the second region is exposed. In the method, in a state where the second region is protected by the deposits formed by carrying out the sequence, the first region is further etched by the plasma of the fluorocarbon gas. The etching rate of the first region etched by the plasma of fluorocarbon after the sequence is performed is higher than the etching rate of the first region in the sequence. Accordingly, according to the method, it is possible to achieve both a scraping suppression of the second region, and a decrease of a processing time required for etching the first region.

In the exemplary embodiment, each time of the sequence may further include a process of generating plasma of a third processing gas containing an oxygen-containing gas and an inert gas within the processing container that accommodates the workpiece. According to the exemplary embodiment, the amount of the deposits formed on the workpiece may be properly reduced by the active species of oxygen. Accordingly, it is possible to suppress an opening of the mask, and an opening formed by etching from being clogged. In the exemplary embodiment, in the processing gas, the oxygen-containing gas is diluted with the inert gas, and thus it is possible to suppress the deposits from being excessively removed.

In each time of the sequence in the exemplary embodiment, a process of generating the plasma of the third processing gas is performed between the process of generating the plasma of the first processing gas, and the process of etching the first region by the radicals of the fluorocarbon. Each time of the sequence may further include a process of generating the plasma of the third processing gas within the processing container that accommodates the workpiece after the process of etching the first region by the radicals of the fluorocarbon is performed. When the process of etching the first region by the radicals of the fluorocarbon is performed, substances constituting the deposits attached to the workpiece are released, and the substances are attached again to the workpiece so that the deposits are formed to narrow the width of the opening of the mask and the opening formed by etching. The deposits, in some cases, may clog the openings. According to the exemplary embodiment, after the process of etching the first region by the radicals of the fluorocarbon is performed, the workpiece is exposed to active species of oxygen. Thus, the deposits which narrow the widths of the openings may be reduced so that the openings may be more reliably prevented from being clogged.

As described above, in the technology of selectively etching the first region formed of silicon oxide, it is possible to suppress the second region formed of silicon nitride from being scraped, and to shorten a processing time.

Hereinafter, various exemplary embodiments will be described in detail with reference to drawings. Meanwhile, it is assumed that in respective drawings, the same reference numerals are given to the same or corresponding parts.

FIG. 1 is a flow chart illustrating an etching method according to an exemplary embodiment. The method MT illustrated in FIG. 1 is a method of selectively etching a first region formed of silicon oxide with respect to a second region formed of silicon nitride by a plasma processing on a workpiece.

Figure 2:
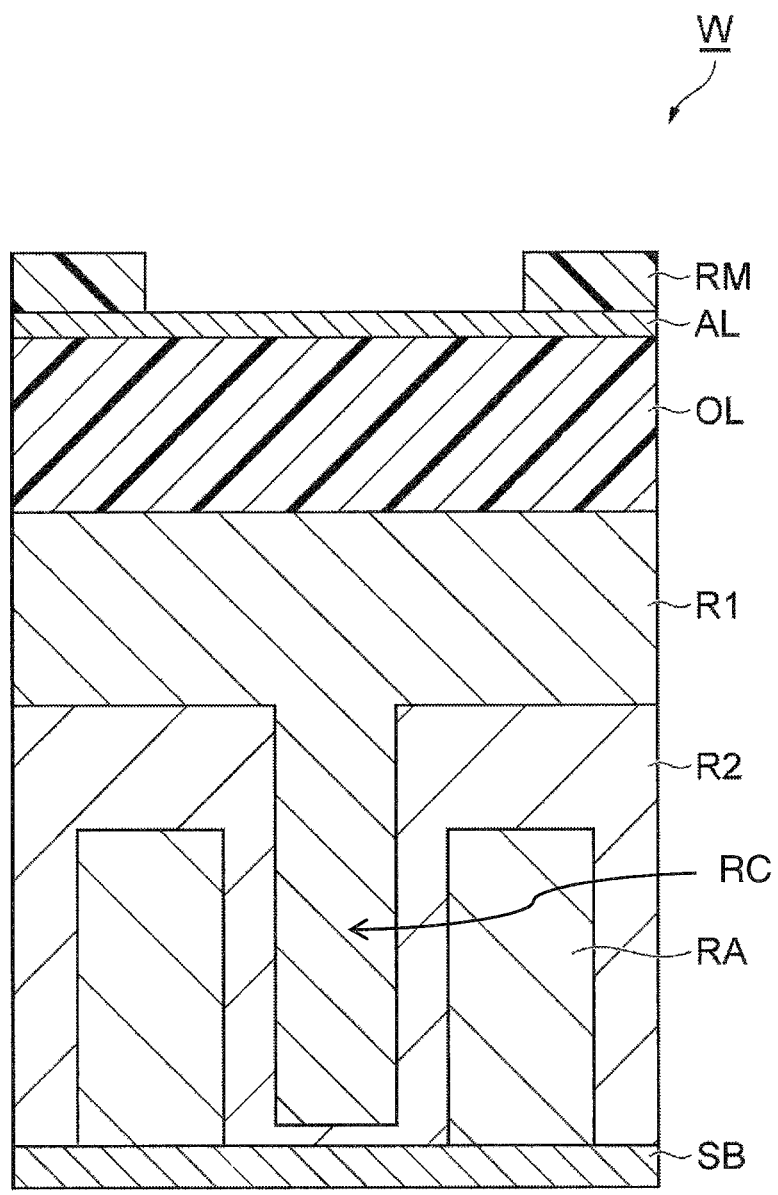
FIG. 2 is a sectional view exemplifying a workpiece to which the etching method according to the exemplary embodiment is applied.

FIG. 2 is a sectional view exemplifying a workpiece to which the etching method according to the exemplary embodiment is applied. As illustrated in FIG. 2, a workpiece, that is, a wafer W, includes a substrate SB, a first region R1, a second region R2, and an organic layer OL constituting a mask later. In an example, the wafer W is obtained in the course of manufacturing a fin field effect transistor and includes a raised area RA, a silicon-containing anti-reflection layer AL, and a resist mask RM.

The raised area RA is formed to be raised from the substrate SB. The raised area RA may constitute, for example, a gate region. The second region R2 is formed of silicon nitride ($Si_3N_4$), and is formed on the top surface of the raised area RA and the top surface of the substrate SB. The second region R2, as illustrated in FIG. 2, extends to define a recess. In an example, the depth of the recess is about 150 nm, and the width of the recess is about 20 nm.

The first region R1 is formed of silicon oxide ($SiO_2$) and is formed on the second region R2. Specifically, the first region R1 is formed to fill the recess defined by the second region R2 and to cover the second region R2.

The organic layer OL is formed on the first region R1. The organic layer OL may be formed of an organic material, for example, an amorphous carbon. The anti-reflection layer AL is formed on the organic layer OL. The resist mask RM is formed on the anti-reflection layer AL. The resist mask RM provides an opening having a width wider than a width of the recess, above the recess defined by the second region R2. The width of the opening of the resist mask RM is, for example, 60 nm. The pattern of the resist mask RM is formed by a photolithography technology.

Figure 3:
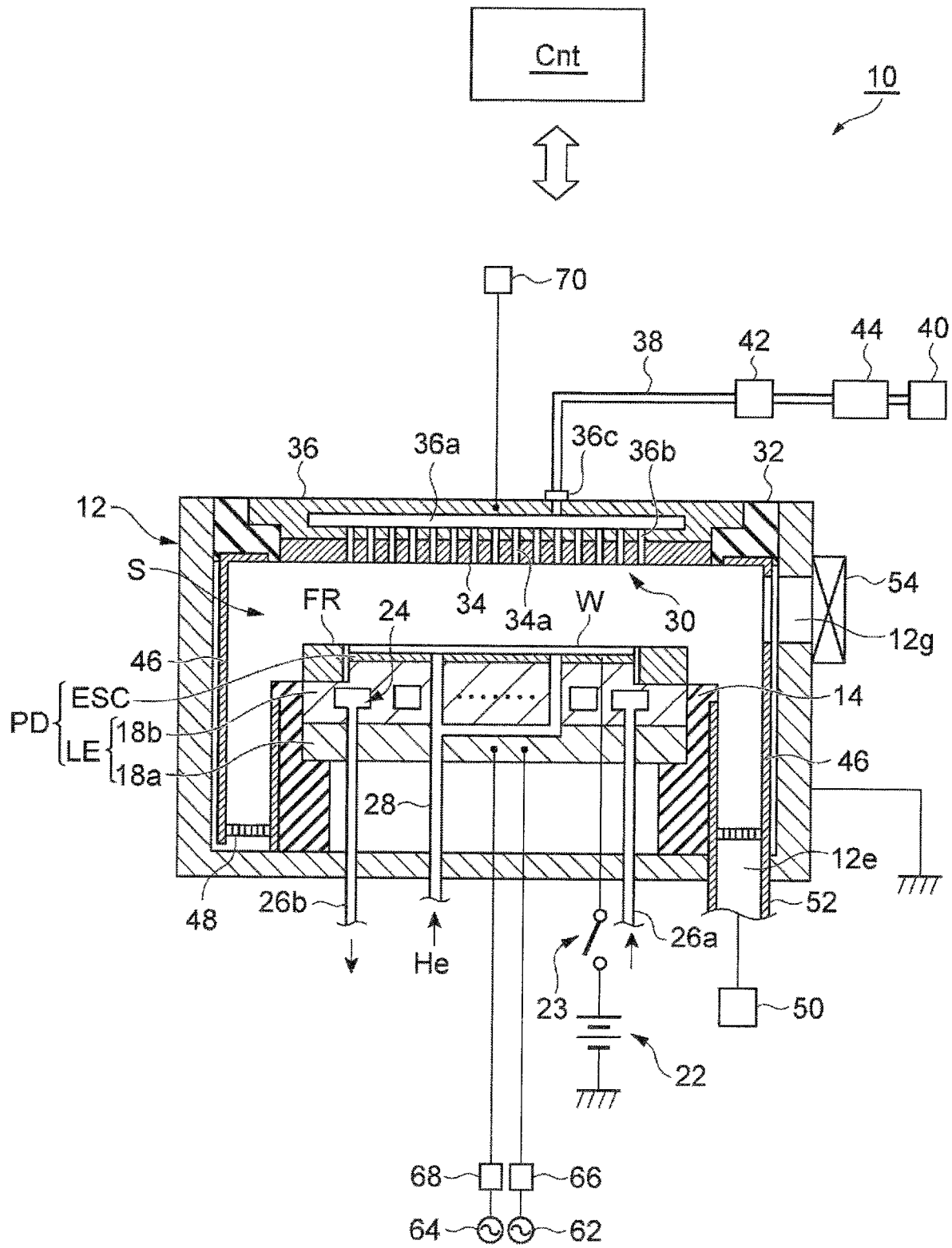
FIG. 3 is a view schematically illustrating an example of a plasma processing apparatus that may be used to carry out the method illustrated in FIG. 1.

In the method MT, the workpiece such as the wafer W illustrated in FIG. 2 is processed within a plasma processing apparatus. FIG. 3 is a view schematically illustrating an example of a plasma processing apparatus that may be used to carry out the method illustrated in FIG. 1. A plasma processing apparatus 10 illustrated in FIG. 3 is a capacitively-coupled plasma etching apparatus, and includes a substantially cylindrical processing container 12. An inner wall surface of the processing container 12 is made of, for example, anodized aluminum. The processing container 12 is frame-grounded.

On a bottom portion of the processing container 12, a substantially cylindrical support unit 14 is provided. The support unit 14 is made of, for example, an insulating material. The support unit 14 vertically extends from the bottom portion of the processing container 12 within the processing container 12. A placing table PD is provided within the processing container 12. The placing table PD is supported by the support unit 14.

The placing table PD holds the wafer W on the top surface thereof. The placing table PD includes a lower electrode LE and an electrostatic chuck ESC. The lower electrode LE includes a first plate 18a and a second plate 18b. Each of the first plate 18a and the second plate 18b is made of a metal such as, for example, aluminum, and has substantially a disk shape. The second plate 18b is provided on the first plate 18a, and is electrically connected to the first plate 18a.

On the second plate 18b, the electrostatic chuck ESC is provided. The electrostatic chuck ESC has a structure where an electrode serving as a conductive film is disposed between a pair of insulating layers or insulating sheets. A DC power supply 22 is electrically connected to the electrode of the electrostatic chuck ESC via a switch 23. The electrostatic chuck ESC attracts the wafer W by an electrostatic force such as a coulomb force generated by a DC voltage from the DC power supply 22. Accordingly, the electrostatic chuck ESC may hold the wafer W thereon.

On the periphery edge of the second plate 18b, a focus ring FR is disposed to surround the edge of the wafer W and the electrostatic chuck ESC. The focus ring FR is provided to improve the uniformity of the etching. The focus ring FR is formed of a material appropriately selected depending on a material of a film to be etched, and may be made of, for example, quartz.

A coolant flow path 24 is formed within the second plate 18b. The coolant flow path 24 constitutes a temperature control mechanism. A coolant is supplied to the coolant flow path 24 from a chiller unit provided outside the processing container 12 through a pipe 26a. The coolant supplied to the coolant flow path 24 is returned to the chiller unit through a pipe 26b. In this manner, between the coolant flow path 24 and the chiller unit, the coolant is circulated. By controlling the temperature of the coolant, the temperature of the wafer W supported by the electrostatic chuck ESC is controlled.

A gas supply line 28 is formed in the plasma processing apparatus 10. The gas supply line 28 supplies a heat transfer gas such as, for example, a He gas, from a heat transfer gas supply mechanism to a gap between the top surface of the electrostatic chuck ESC and the rear surface of the wafer W.

The plasma processing apparatus 10 includes an upper electrode 30. The upper electrode 30 is disposed to face the placing table PD above the placing table PD. The lower electrode LE and the upper electrode 30 are provided substantially parallel to each other. Between the upper electrode 30 and the lower electrode LE, a processing space S is provided to perform a plasma processing on the wafer W.

The upper electrode 30 is supported at the top portion of the processing container 12 through an insulating shielding member 32. In the exemplary embodiment, the upper electrode 30 may be configured such that a distance from the top surface of the placing table PD, that is, the wafer placing surface, in a vertical direction is variable. The upper electrode 30 may include an electrode plate 34 and an electrode support 36. The electrode plate 34 faces the processing space S, and a plurality of gas ejecting holes 34a are formed in the electrode plate 34. The electrode plate 34 is made of silicon in the exemplary embodiment.

The electrode support 36 is configured to detachably support the electrode plate 34 and may be made of, for example, a conductive material such as aluminum. The electrode support 36 may have a water-cooling structure. A gas diffusion chamber 36a is formed within the electrode support 36. A plurality of gas flow holes 36b extend downwards from the gas diffusion chamber 36a to communicate with the gas ejecting holes 34a. A gas inlet port 36c is formed in the electrode support 36 to guide a processing gas into the gas diffusion chamber 36a. A gas supply pipe 38 is connected to the gas inlet port 36c.

A gas source group 40 is connected to the gas supply pipe 38 through a valve group 42 and a flow rate controller group 44. The gas source group 40 includes a plurality of gas sources. In an example, the gas source group 40 includes one or more sources of a fluorocarbon gas, a source of a rare gas, a source of a nitrogen gas ($N_2$ gas), a source of a hydrogen gas ($H_2$ gas), and a source of an oxygen-containing gas. One or more sources of the fluorocarbon gas, in an example, may include a source of $C_4F_8$ gas, a source of $CF_4$ gas, and a source of $C_4F_6$ gas. The source of the rare gas may be a source of any rare gas such as He gas, Ne gas, Ar gas, Kr gas, or Xe gas, and may be, in an example, a source of Ar gas. The source of the oxygen-containing gas may be, in an example, a source of oxygen gas ($O_2$ gas). Meanwhile, the oxygen-containing gas may be any gas containing oxygen, and may be, for example, a carbon oxide gas such as CO gas or $CO_2$ gas.

The valve group 42 includes a plurality of valves, and the flow rate controller group 44 includes a plurality of flow rate controllers such as, for example, a mass flow controller. The plurality of gas sources of the gas source group 40 are connected to the gas supply pipe 38 through respective corresponding valves of the valve group 42, and respective corresponding flow controllers of the flow rate controller group 44.

In the plasma processing apparatus 10, a deposition shield 46 is detachably provided along the inner wall of the processing container 12. The deposition shield 46 is also provided on the outer periphery of the support unit 14. The deposition shield 46 is configured to suppress etching by-products (deposits) from being attached to the processing container 12, and may be formed by coating a ceramic such as, for example, $Y_2O_3$ on an aluminum material.

An exhaust plate 48 is provided on the bottom side of the processing container 12 between the support unit 14 and the side wall of the processing container 12. The exhaust plate 48 may be formed by coating a ceramic such as, for example, $Y_2O_3$ on an aluminum material. An exhaust port 12e is formed below the exhaust plate 48 in the processing container 12. An exhaust device 50 is connected to the exhaust port 12e through an exhaust pipe 52. The exhaust device 50 includes a vacuum pump such as, for example, a turbo molecular pump and may decompress the space within the processing container 12 to a desired degree of vacuum. A carry-in/out port 12g of the wafer W is formed in the side wall of the processing container 12. The carry-in/out port 12g is configured to be capable of being opened/closed by a gate valve 54.

The plasma processing apparatus 10 further includes a first high frequency power supply 62 and a second high frequency power supply 64. The first high frequency power supply 62 is a power supply which generates a high frequency power for generating plasma and generates a high frequency power of a frequency ranging from, for example, 27 MHz to 100 MHz. The first high frequency power supply 62 is connected to the lower electrode LE through a matching unit 66. The matching unit 66 is a circuit configured to match an output impedance of the first high frequency power supply 62 to an input impedance of a load side (a lower electrode LE side). The first high frequency power supply 62 may be connected to the upper electrode 30 through the matching unit 66.

The second high frequency power supply 64 is a power supply which generates a high frequency bias power for drawing ions into the wafer W, and generates a high frequency bias power of a frequency ranging from, for example, 400 kHz to 13.56 MHz. The second high frequency power supply 64 is connected to the lower electrode LE through a matching unit 68. The matching unit 68 is a circuit configured to match an output impedance of the second high frequency power supply 64 to an input impedance of a load side (a lower electrode LE side).

The plasma processing apparatus 10 further includes a power supply 70. The power supply 70 is connected to the upper electrode 30. The power supply 70 applies a voltage for drawing positive ions present within the processing space S to the electrode plate 34, to the upper electrode 30. In an example, the power supply 70 is a DC power supply for generating a negative DC voltage. In another example, the power supply 70 may be an AC power supply for generating an AC voltage of a relatively low frequency. The voltage applied to the upper electrode from the power supply 70 may be a voltage of −150 V or less. That is, the voltage applied to the upper electrode 30 by the power supply 70 may be a negative voltage having an absolute value of 150 V or more. When the voltage is applied to the upper electrode 30 from the power supply 70, positive ions present in the processing space S collide with the electrode plate 34. Accordingly, secondary electrons and/or silicon are released from the electrode plate 34. The released silicon combines with active species of fluorine present in the processing space S to reduce the amount of the active species of fluorine.

In the exemplary embodiment, the plasma processing apparatus 10 may further include a controller Cnt. The controller Cnt is a computer provided with, for example, a processor, a storage unit, an input device, and a display device, and controls respective units of the plasma processing apparatus 10. The controller Cnt allows an operator to perform, for example, the input operation of a command through the input device in order to manage the plasma processing apparatus 10, and allows the display device to visually display the driving situation of the plasma processing apparatus 10. The storage unit of the controller Cnt stores a control program which controls the processor to execute various processings in the plasma processing apparatus 10, or a program which causes respective units of the plasma processing apparatus 10 to execute the processings according to processing conditions, i.e., a processing recipe.

Hereinafter, the method MT will be described in detail with reference to FIG. 1 again. The following description appropriately refers to FIGS. 2, and 4 to 11. FIGS. 4 to 11 are sectional views illustrating the workpiece after each step of the method MT is performed. Meanwhile, the following descriptions will be made on an example of a processing of the wafer W illustrated in FIG. 2, using one plasma processing apparatus 10 illustrated in FIG. 3 in the method MT.

First, in the method MT, the wafer W illustrated in FIG. 2 is carried into the plasma processing apparatus 10, placed on the placing table PD, and held by the placing table PD.

In the method MT, then, step ST1 is performed. In step ST1, the anti-reflection layer AL is etched. Thus, in step ST1, a processing gas is supplied into the processing container 12 from a gas source selected from the plurality of gas sources of the gas source group 40. The processing gas contains a fluorocarbon gas. The fluorocarbon gas may contain, for example, at least one kind of $C_4F_8$ gas and $CF_4$ gas. The processing gas may further contain a rare gas, for example, Ar gas. In step ST1, the exhaust device 50 is operated such that the pressure within the processing container 12 is set to a predetermined pressure. Also, in step ST1, the high frequency power is supplied from the first high frequency power supply 62 to the lower electrode LE, and the high frequency bias power is supplied from the second high frequency power supply 64 to the lower electrode LE.

Hereinafter, various conditions in step ST1 will be exemplified.

Pressure within processing container: 10 mTorr (1.33 Pa) to 50 mTorr (6.65 Pa)
Processing gas
  $C_4F_8$ gas: 10 sccm to 30 sccm
  $CF_4$ gas: 150 sccm to 300 sccm
  Ar gas: 200 sccm to 500 sccm
High frequency power for generating plasma: 300 W to 1000 W
High frequency bias power: 200 W to 500 W
Voltage of power supply 70: 0 V to −500 V
Temperature of wafer W: 20° C. to 80° C.

Figure 4:
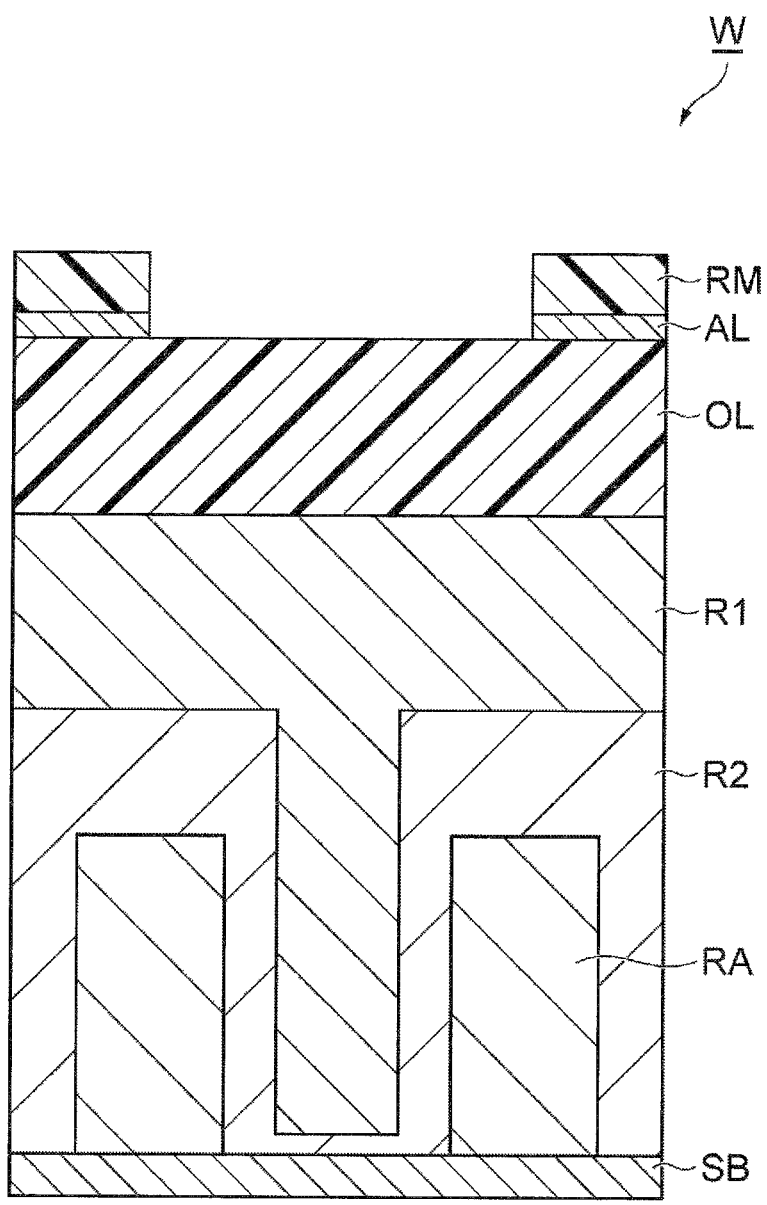
FIG. 4 is a sectional view illustrating the workpiece after each step of the method illustrated in FIG. 1 is performed.

In step ST1, the plasma of the processing gas is generated, and the anti-reflection layer AL is etched at the portion exposed from the opening of the resist mask RM by the active species of the fluorocarbon. As a result, as illustrated in FIG. 4, among the whole area of the anti-reflection layer AL, the portion exposed from the opening of the resist mask RM is removed. That is, a pattern of the resist mask RM is transferred to the anti-reflection layer AL so that a pattern for providing an opening in the anti-reflection layer AL is formed. Meanwhile, the above described operations of the respective units of the plasma processing apparatus 10, in step ST1, may be controlled by the controller Cnt.

Then, in step ST2, the organic layer OL is etched. Thus, in step ST2, a processing gas is supplied into the processing container 12 from a gas source selected from the plurality of gas sources of the gas source group 40. The processing gas may further contain a hydrogen gas and a nitrogen gas. The processing gas used in step ST2 may be any processing gas containing another gas such as, for example, an oxygen gas as long as it can etch the organic layer. Also, in step ST2, the exhaust device 50 is operated such that the pressure within the processing container 12 is set to a predetermined pressure. Also, in step ST2, the high frequency power is supplied from the first high frequency power supply 62 to the lower electrode LE, and the high frequency bias power is supplied from the second high frequency power supply 64 to the lower electrode LE.

Hereinafter, various conditions in step ST2 will be exemplified.

Pressure within processing container: 50 mTorr (6.65 Pa) to 200 mTorr (26.6 Pa)
Processing gas
  $N_2$ gas: 200 sccm to 400 sccm
  $H_2$ gas: 200 sccm to 400 sccm
High frequency power for generating plasma: 500 W to 2000 W
High frequency bias power: 200 W to 500 W
Voltage of power supply 70: 0 V
Temperature of wafer W: 20° C. to 80° C.

Figure 5:
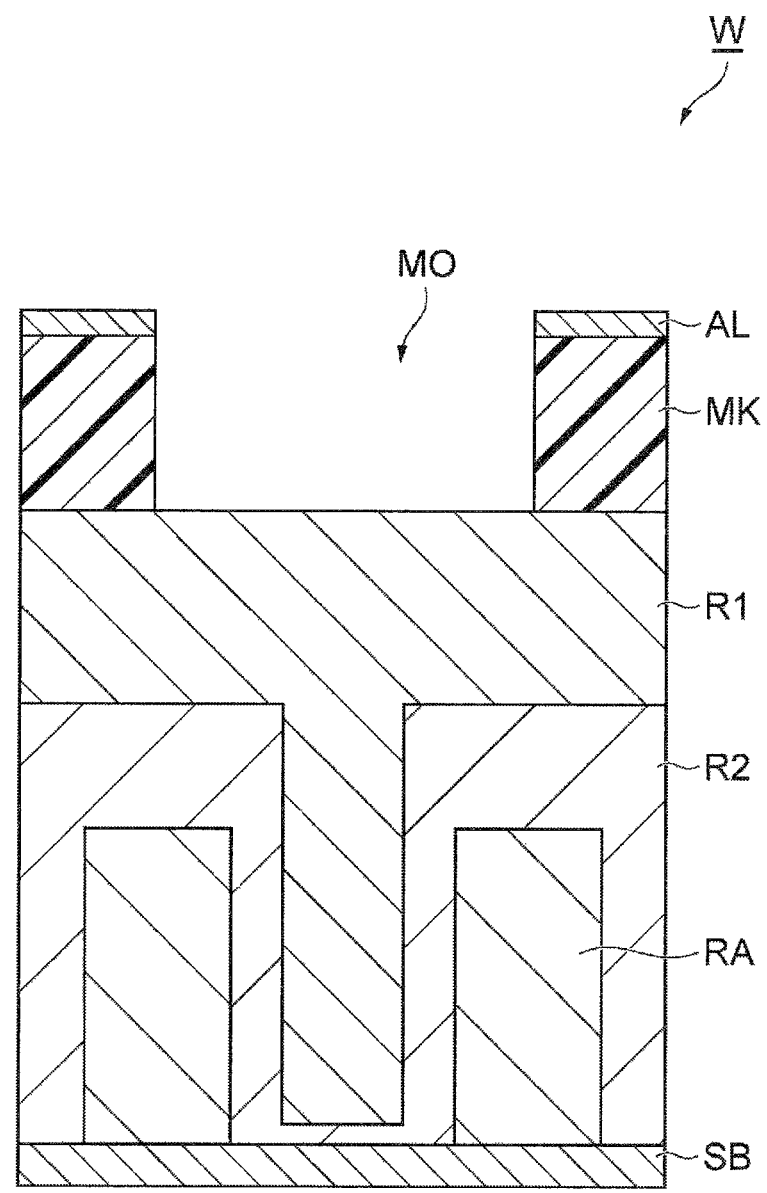
FIG. 5 is a sectional view illustrating the workpiece after each step of the method illustrated in FIG. 1 is performed.

In step ST2, the plasma of the processing gas is generated, and the organic layer OL is etched at the portion exposed from the opening of the anti-reflection layer AL. Also, the resist mask RM is etched. As a result, as illustrated in FIG. 5, the resist mask RM is removed, and among the whole area of the organic layer OL, the portion exposed from the opening of the anti-reflection layer AL is removed. That is, a pattern of the anti-reflection layer AL is transferred to the organic layer OL so that a pattern for providing an opening MO in the organic layer OL is formed, and a mask MK is generated from the organic layer OL. Meanwhile, the above described operations of the respective units of the plasma processing apparatus 10, in step ST2, may be controlled by the controller Cnt.

In an exemplary embodiment, after step ST2 is performed, step ST3 is performed. In step ST3, the first region R1 is etched until just before the second region R2 is exposed. That is, the first region R1 is etched until the first region R1 is slightly left on the second region R2. Thus, in step ST3, a processing gas is supplied into the processing container 12 from a gas source selected from the plurality of gas sources of the gas source group 40. The processing gas contains a fluorocarbon gas. Also, the processing gas may further contain a rare gas, for example, Ar gas. Also, the processing gas may further contain an oxygen gas. Also, in step ST3, the exhaust device 50 is operated such that the pressure within the processing container 12 is set to a predetermined pressure. Also, in step ST3, the high frequency power is supplied from the first high frequency power supply 62 to the lower electrode LE, and the high frequency bias power is supplied from the second high frequency power supply 64 to the lower electrode LE.

Figure 6:
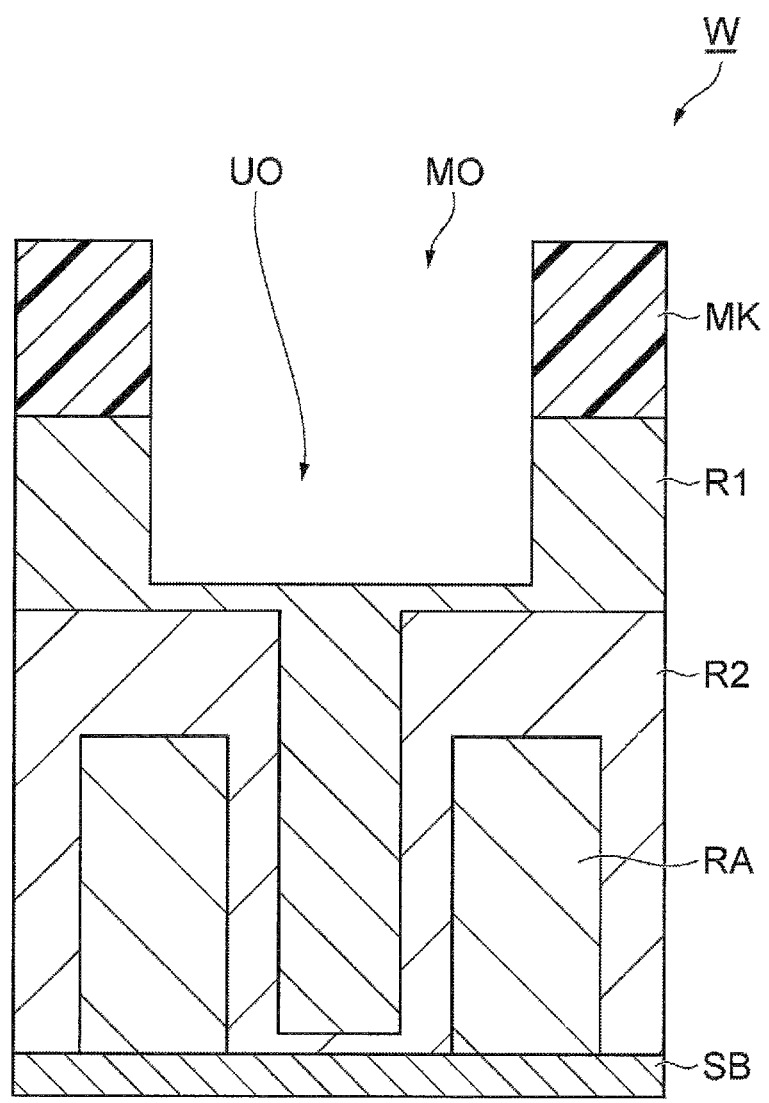
FIG. 6 is a sectional view illustrating the workpiece after each step of the method illustrated in FIG. 1 is performed.

In step ST3, the plasma of the processing gas is generated, and the first region R1 is etched at the portion exposed from the opening of the mask MK by the active species of the fluorocarbon. The processing time in step ST3 is set such that at the end of step ST3, the first region R1 is left to a predetermined film thickness on the second region R2. As a result of the execution of step ST3, as illustrated in FIG. 6, an upper opening UO is partially formed. Meanwhile, the above described operations of the respective units of the plasma processing apparatus 10, in step ST3, may be controlled by the controller Cnt.

Here, in step ST11 to be described later, a condition for a mode in which formation of deposits containing fluorocarbon on the top surface of the wafer W including the first region R1 is dominant instead of etching of the first region R1, that is, a condition for a deposition mode is selected. Meanwhile, in step ST3, a condition for a mode in which etching of the first region R1 is dominant instead of formation of deposits, that is a condition for an etching mode is selected. Thus, in an example, the fluorocarbon gas used in step ST3 may contain at least one kind of $C_4F_8$ gas and $CF_4$ gas. The fluorocarbon gas in this example is a fluorocarbon gas having a higher ratio of the number of fluorine atoms to the number of carbon atoms (that is, number of fluorine atoms/number of carbon atoms), than a ratio of the number of fluorine atoms to the number of carbon atoms (that is, number of fluorine atoms/number of carbon atoms) of the fluorocarbon gas used in step ST11. Also, in an example, in order to increase the dissociation degree of the fluorocarbon gas, the high frequency power for generating plasma used in step ST3 may be set to be higher than the high frequency power for generating plasma used in step ST11. According to these examples, it is possible to realize the etching mode. In an example, the high frequency bias power used in step ST3 may also be set to be higher than the high frequency bias power used in step ST11. According to this example, the energy of ions to be drawn to the wafer W may be increased so that the first region R1 may be etched at a high speed.

Hereinafter, various conditions in step ST3 will be exemplified.

Pressure within processing container: 10 mTorr (1.33 Pa) to 50 mTorr (6.65 Pa)
Processing gas
 $C_4F_8$ gas: 10 sccm to 30 sccm
 $CF_4$ gas: 50 sccm to 150 sccm
 Ar gas: 500 sccm to 1000 sccm
 $O_2$ gas: 10 sccm to 30 sccm
High frequency power for generating plasma: 500 W to 2000 W
High frequency bias power: 500 W to 2000 W
Voltage of power supply 70: 0 V to 600 V
Temperature of wafer W: 20° C. to 80° C.

In an exemplary embodiment, subsequently, step ST4 is performed. In step ST4, the plasma of a processing gas containing an oxygen-containing gas is generated within the processing container 12. Thus, in step ST4, a processing gas is supplied into the processing container 12 from a gas source selected from the plurality of gas sources of the gas source group 40. The processing gas, in an example, may contain an oxygen gas as an oxygen-containing gas. The processing gas may further contain an inert gas such as a rare gas (e.g., Ar gas) or a nitrogen gas. Also, in step ST4, the exhaust device 50 is operated such that the pressure within the processing container 12 is set to a predetermined pressure. Also, in step ST4, the high frequency power is supplied from the first high frequency power supply 62 to the lower electrode LE. Also, in step ST4, the high frequency bias power may not be supplied from the second high frequency power supply 64 to the lower electrode LE.

Figure 7:
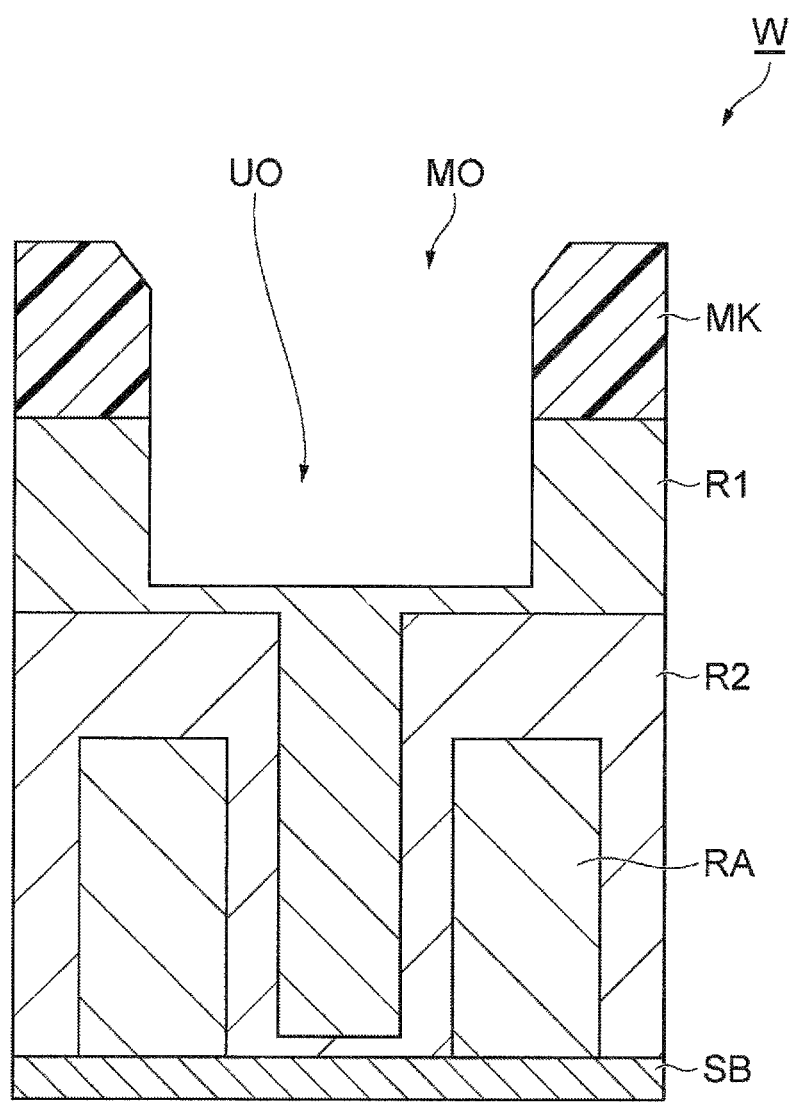
FIG. 7 is a sectional view illustrating the workpiece after each step of the method illustrated in FIG. 1 is performed.

In step ST4, the active species of oxygen is generated and the opening MO of the mask MK is widened at its upper end portion by the active species of the oxygen. Specifically, as illustrated in FIG. 7, the upper shoulder portion of the mask MK which defines the upper end portion of the opening MO is etched to exhibit a tapered shape. Accordingly, even when deposits produced in the subsequent steps are attached to the surface of the mask MK defining the opening MO, the reduction amount of the width of the opening MO may be reduced. Meanwhile, the above described operations of the respective units of the plasma processing apparatus 10, in step ST4, may be controlled by the controller Cnt.

Here, step ST12 to be described below is to reduce a trace quantity of deposits formed during a sequence SQ, and it is required to suppress an excessive decrease of the deposits. Meanwhile, step ST4 is performed to widen the width of the upper end portion of the opening MO of the mask MK, and its processing time is required to be short.

Hereinafter, various conditions in step ST4 will be exemplified.

Pressure within processing container: 30 mTorr (3.99 Pa) to 200 mTorr (26.6 Pa)
Processing gas
 $O_2$ gas: 50 sccm to 500 sccm
 Ar gas: 200 sccm to 1500 sccm
High frequency power for generating plasma: 100 W to 500 W
High frequency bias power: 0 W to 200 W
Voltage of power supply 70: 0 V
Temperature of wafer W: 20° C. to 200° C.

Subsequently, in the method MT, in a period including the time of exposing the second region R2, in order to etch the first region R1, a sequence SQ is carried out one or more times. In the sequence SQ, first, step ST11 is performed. In step ST11, the plasma of the processing gas (a first processing gas) is generated within the processing container 12 accommodating the wafer W. Thus, in step ST11, a processing gas is supplied into the processing container 12 from a gas source selected from the plurality of gas sources of the gas source group 40. The processing gas contains a fluorocarbon gas. The processing gas may further contain a rare gas, for example, Ar gas. Also, in step ST11, the exhaust device 50 is operated such that the pressure within the processing container 12 is set to a predetermined pressure. Also, in step ST11, the high frequency power is supplied from the first high frequency power supply 62 to the lower electrode LE.

Figure 8:
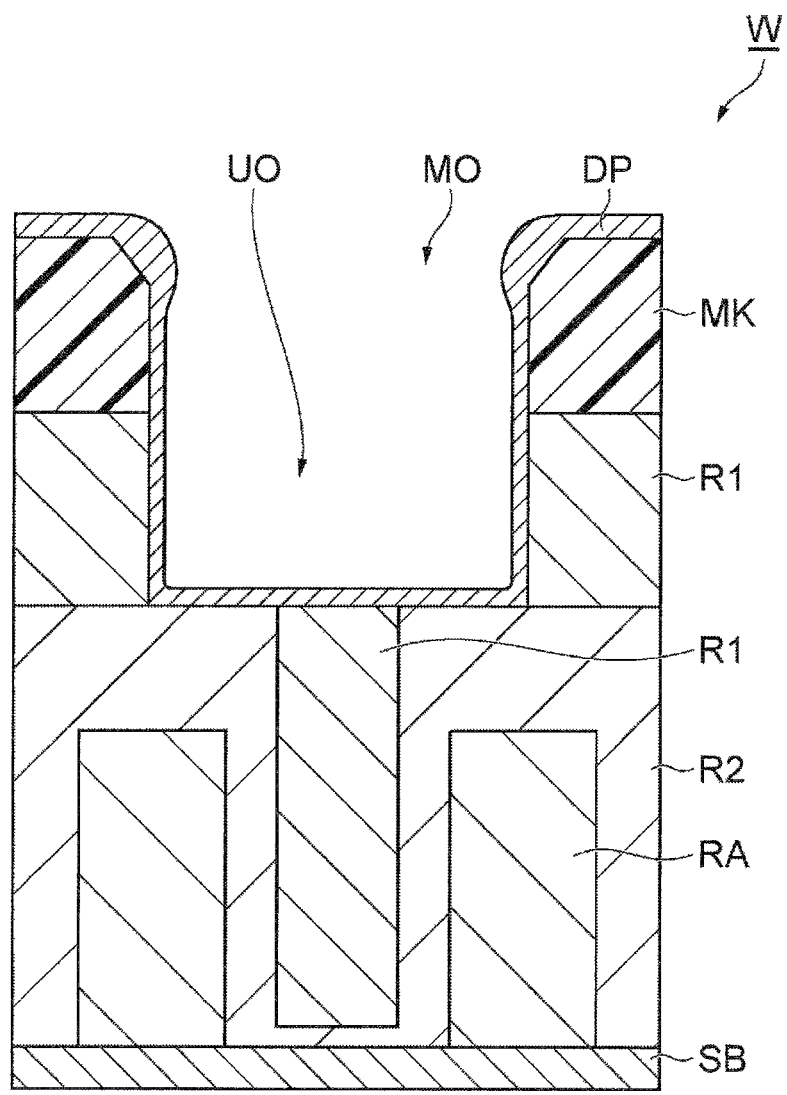
FIG. 8 is a sectional view illustrating the workpiece after each step of the method illustrated in FIG. 1 is performed.

In step ST11, the plasma of a processing gas containing a fluorocarbon gas is generated, and the dissociated fluorocarbon is deposited on the top surface of the wafer W to form deposits DP (see, e.g., FIG. 8). The above described operations of the respective units of the plasma processing apparatus 10, in step ST11, may be controlled by the controller Cnt.

As described above, in step ST11, a condition for a deposition mode is selected. Thus, in an example, $C_4F_6$ gas is used as the fluorocarbon gas.

Hereinafter, various conditions in step ST11 will be exemplified.
  Pressure within processing container: 10 mTorr (1.33 Pa) to 50 mTorr (6.65 Pa)
  Processing gas
    $C_4F_6$ gas: 2 sccm to 10 sccm
    Ar gas: 500 sccm to 1500 sccm
  High frequency power for generating plasma: 100 W to 500 W
  High frequency bias power: 0 W
  Voltage of power supply 70: 0 V to 600 V
  Temperature of wafer W: 20° C. to 200° C.

In the sequence SQ of the exemplary embodiment, subsequently, step ST12 is performed. In step ST12, the plasma of a processing gas (a third processing gas) containing an oxygen-containing gas and an inert gas is generated within the processing container 12. Thus, in step ST12, a processing gas is supplied into the processing container 12 from a gas source selected from the plurality of gas sources of the gas source group 40. In an example, the processing gas contains an oxygen gas as the oxygen-containing gas. In an example, the processing gas contains a rare gas such as Ar gas, as an inert gas. The inert gas may be a nitrogen gas. Also, in step ST12, the exhaust device 50 is operated such that the pressure within the processing container 12 is set to a predetermined pressure. In step ST12, the high frequency power is supplied from the first high frequency power supply 62 to the lower electrode LE. In step ST12, the high frequency bias power may not be supplied from the second high frequency power supply 64 to the lower electrode LE.

Figure 9:
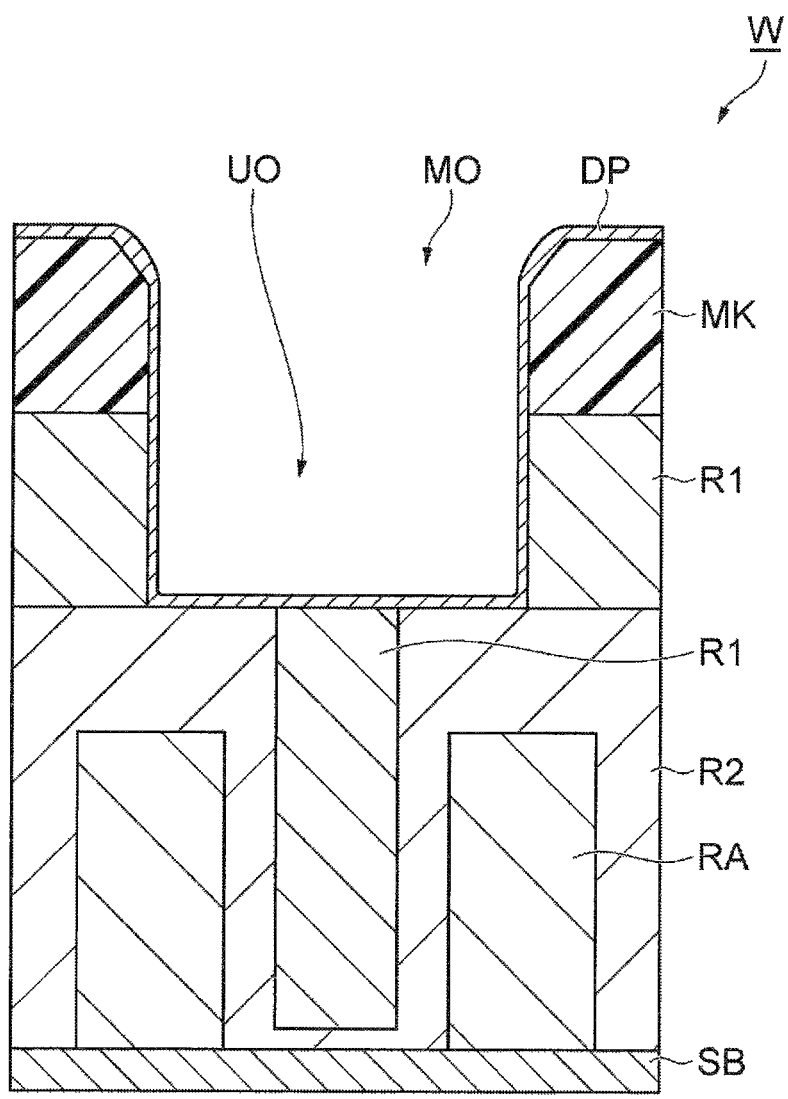
FIG. 9 is a sectional view illustrating the workpiece after each step of the method illustrated in FIG. 1 is performed.

In step ST12, the active species of oxygen is generated, and the amount of the deposits DP on the wafer W is properly reduced by the active species of oxygen (see, e.g., FIG. 9). As a result, the opening MO and the upper opening UO are suppressed from being clogged by excessive deposits DP. In the processing gas used in step ST12, the oxygen gas is diluted with the inert gas, and thus it is possible to suppress the deposits DP from being excessively removed. The above described operations of the respective units of the plasma processing apparatus 10, in step ST12, may be controlled by the controller Cnt.

Hereinafter, various conditions in step ST12 will be exemplified.
  Pressure within processing container: 10 mTorr (1.33 Pa) to 50 mTorr (6.65 Pa)
  Processing gas
    $O_2$ gas: 2 sccm to 20 sccm
    Ar gas: 500 sccm to 1500 sccm
  High frequency power for generating plasma: 100 W to 500 W
  High frequency bias power: 0 W
  Voltage of power supply 70: 0 V
  Temperature of wafer W: 20° C. to 200° C.

In the exemplary embodiment, step ST12 of the sequence SQ of each time is performed for 2 sec or more, and the deposits DP may be etched at a rate of 1 nm/sec or less in step ST12. In order to carry out the sequence SQ using a plasma processing apparatus such as the plasma processing apparatus 10, a time is required to switch gases for transition between respective steps ST11, ST12, and ST13. Accordingly, in consideration of a time required for stabilizing a discharge, step ST12 needs to be performed at least 2 sec. However, when the rate of etching of the deposits DP in a period of such a length of time is excessively high, deposits for protecting the second region R2 may be excessively removed. Thus, in step ST12, the deposits DP are etched at a rate of 1 nm/sec or less. Accordingly, it is possible to properly adjust the amount of the deposits DP formed on the wafer W. Meanwhile, the rate of 1 nm/sec or less in the etching of the deposits DP in step ST12 may be achieved by selecting a pressure within a processing container, the oxygen dilution degree with a rare gas in the processing gas, that is, an oxygen concentration, and a high frequency power for generating plasma from the above described conditions.

In the sequence SQ, subsequently, step ST13 is performed. In step ST13, the first region R1 is etched. Thus, in step ST13, a processing gas is supplied into the processing container 12 from a gas source selected from the plurality of gas sources of the gas source group 40. The processing gas contains an inert gas. The inert gas, in an example, may be a rare gas such as, for example, Ar gas. Otherwise, the inert gas may be a nitrogen gas. Also, in step ST13, the exhaust device 50 is operated such that the pressure within the processing container 12 is set to a predetermined pressure. Also, in step ST13, the high frequency power is supplied from the first high frequency power supply 62 to the lower electrode LE. Also, in step ST13, the high frequency bias power is supplied from the second high frequency power supply 64 to the lower electrode LE.

Hereinafter, various conditions in step ST13 will be exemplified.
  Pressure within processing container: 10 mTorr (1.33 Pa) to 50 mTorr (6.65 Pa)
  Processing gas
    Ar gas: 500 sccm to 1500 sccm
  High frequency power for generating plasma: 100 W to 500 W
  High frequency bias power: 20 W to 300 W In step ST13, the plasma of the inert gas is generated, and ions are drawn into the wafer W. The first region R1 is etched by radicals of fluorocarbon included in the deposits DP (see, e.g., FIG. 10). The above described operations of the respective units of the plasma processing apparatus 10, in step ST13, may be controlled by the controller Cnt.

Figure 10:
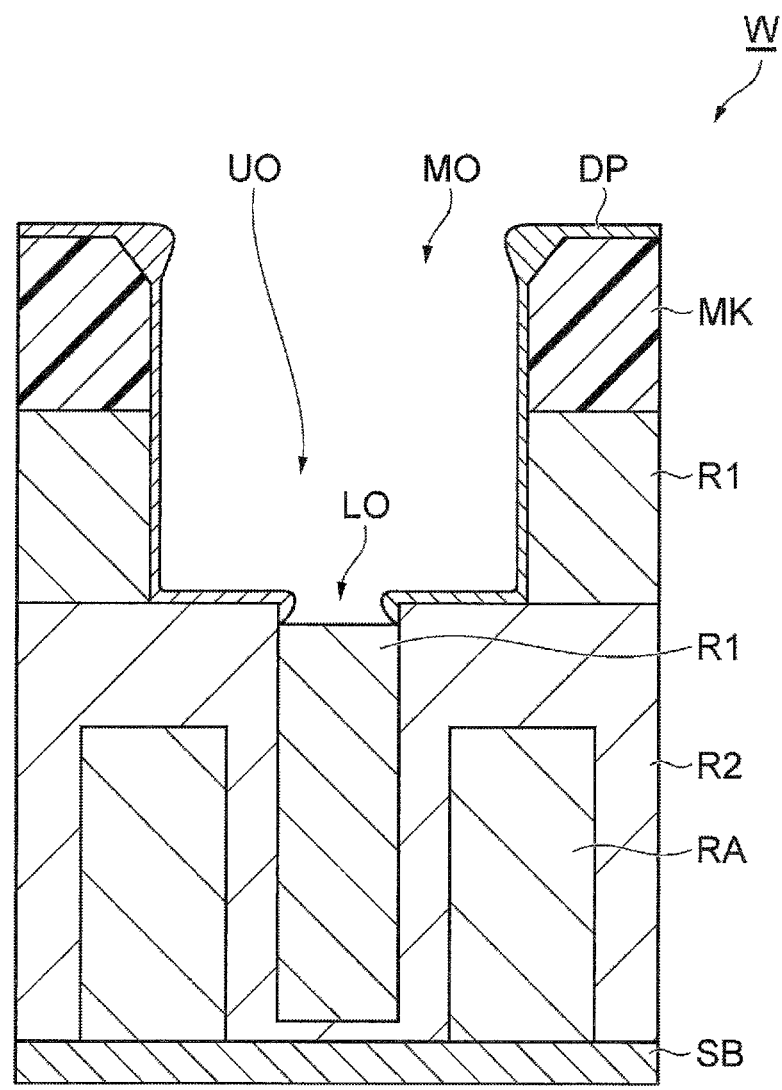
FIG. 10 is a sectional view illustrating the workpiece after each step of the method illustrated in FIG. 1 is performed.

In the method MT, the sequence SQ is carried out in a period including the time of exposing the second region R2. In step ST11 of the sequence SQ, as illustrated in FIG. 8, the deposits DP are formed on the wafer W. Meanwhile, FIG. 8 illustrates a state where the first region R1 is gradually etched, the second region R2 is exposed, and deposits DP are formed on the second region R2. The deposits DP protect the second region R2. In step ST12 of the sequence SQ, as illustrated in FIG. 9, the amount of the deposits DP formed in step ST11 is decreased. In step ST13 of the sequence SQ, the first region R1 is etched by radicals of fluorocarbon included in the deposits DP. By the sequence SQ, the second region R2 is exposed, and then the second region R2 is protected by the deposits DP and the first region R1 within the recess provided by the second region R2 is slightly etched. Accordingly, as illustrated in FIG. 10, a lower opening LO is gradually formed.

The sequence SQ is repeated one or more times. Accordingly, as illustrated in FIG. 1, after step ST13 is performed, it is determined whether a stop condition is satisfied in step STJ. The stop condition is determined to be satisfied when the sequence SQ has been carried out a predetermined number of times. In step STJ, when it is determined that the stop condition is not satisfied, the sequence SQ is carried out from step ST11. Meanwhile, in step STJ, when it is determined that a stop condition is satisfied, subsequently, step ST5 is performed.

In step ST5, the first region R1 is further etched. In step ST5, a processing gas (a second processing gas) is supplied into the processing container 12 from a gas source selected from the plurality of gas sources of the gas source group 40. The processing gas contains a fluorocarbon gas. The processing gas may further contain a rare gas, for example, Ar gas. Also, the processing gas may further contain an oxygen gas. Also, in step ST5, the exhaust device 50 is operated such that the pressure within the processing container 12 is set to a predetermined pressure. Also, in step ST5, the high frequency power is supplied from the first high frequency power supply 62 to the lower electrode LE, and the high frequency bias power is supplied from the second high frequency power supply 64 to the lower electrode LE. Meanwhile, in step ST5, a voltage having a negative voltage value may be applied to the upper electrode 30 from the power supply 70.

Figure 11:
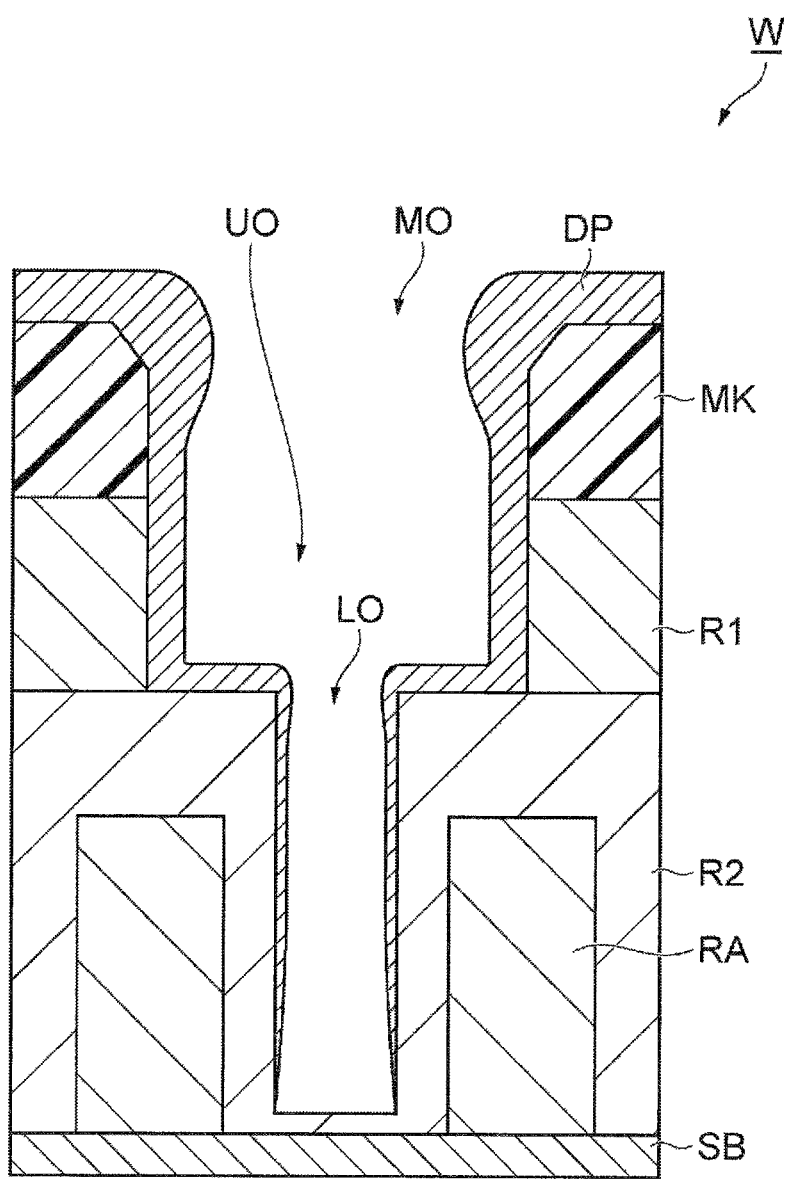
FIG. 11 is a sectional view illustrating the workpiece after each step of the method illustrated in FIG. 1 is performed.

In step ST5, the plasma of the processing gas is generated, and the first region R1 within the recess is etched by the active species of fluorocarbon. In step ST5, in the exemplary embodiment, as illustrated in FIG. 11, the first region R1 is etched until the bottom of the recess is exposed. That is, in step ST5, the plasma of the processing gas is continuously generated so that etching of the first region R1 is continued to the bottom of the recess.

In step ST5, a condition for a mode in which etching of the first region R1 by the active species of fluorocarbon is dominant, instead of formation of deposits of fluorocarbon, that is, a condition for an etching mode is selected. Thus, in an example, the fluorocarbon gas used in step ST5 is $C_4F_6$ gas. Meanwhile, the fluorocarbon gas used in step ST5 may contain at least one kind of $C_4F_8$ gas and $CF_4$ gas. In an example, in order to increase the dissociation degree of the fluorocarbon gas, the high frequency power for generating plasma used in step ST5 may be set to be higher than the high frequency power for generating plasma used in step ST11. According to these examples, it is possible to realize the etching mode. In an example, the high frequency bias power used in step ST5 may also be set to be higher than the high frequency bias power used in step ST11. According to this example, the energy of ions to be drawn to the wafer W may be increased so that the first region R1 may be etched at a high speed.

Hereinafter, various conditions in step ST5 will be exemplified.

Pressure within processing container: 10 mTorr (1.33 Pa) to 50 mTorr (6.65 Pa)
Processing gas
$C_4F_6$ gas: 2 sccm to 10 sccm
Ar gas: 500 sccm to 2000 sccm
$O_2$ gas: 2 sccm to 20 sccm High frequency power for generating plasma: 100 W to 500 W
High frequency bias power: 20 W to 300 W
Voltage of power supply 70: 0 V to 900 V
Temperature of wafer W: 20° C. to 200° C.

In the sequence SQ of the method MT, the deposits DP of fluorocarbon are formed on the wafer W when the second region R2 is exposed. Then, the first region R1 is etched by radicals in the deposits DP. By the sequence SQ, although the etching rate is low, the first region R1 is etched, and the second region is suppressed from being scraped when the second region is exposed. In the method MT, in a state where the second region R2 is protected by the deposits DP formed by carrying out the sequence SQ, step ST5 is performed. In step ST5, the first region is further etched by the plasma of the fluorocarbon gas. The etching rate of the first region R1 in step ST5 is higher than the etching rate of the first region R1 in the sequence SQ. Accordingly, as compared to a processing time when the first region R1 is etched to the bottom of the recess by repeatedly carrying out the sequence SQ, the processing time of the method MT is largely shortened. Thus, according to the method MT, it is possible to achieve both a scraping suppression of the second region R2, and a decrease of a processing time required for etching the first region R1.

Figure 12:
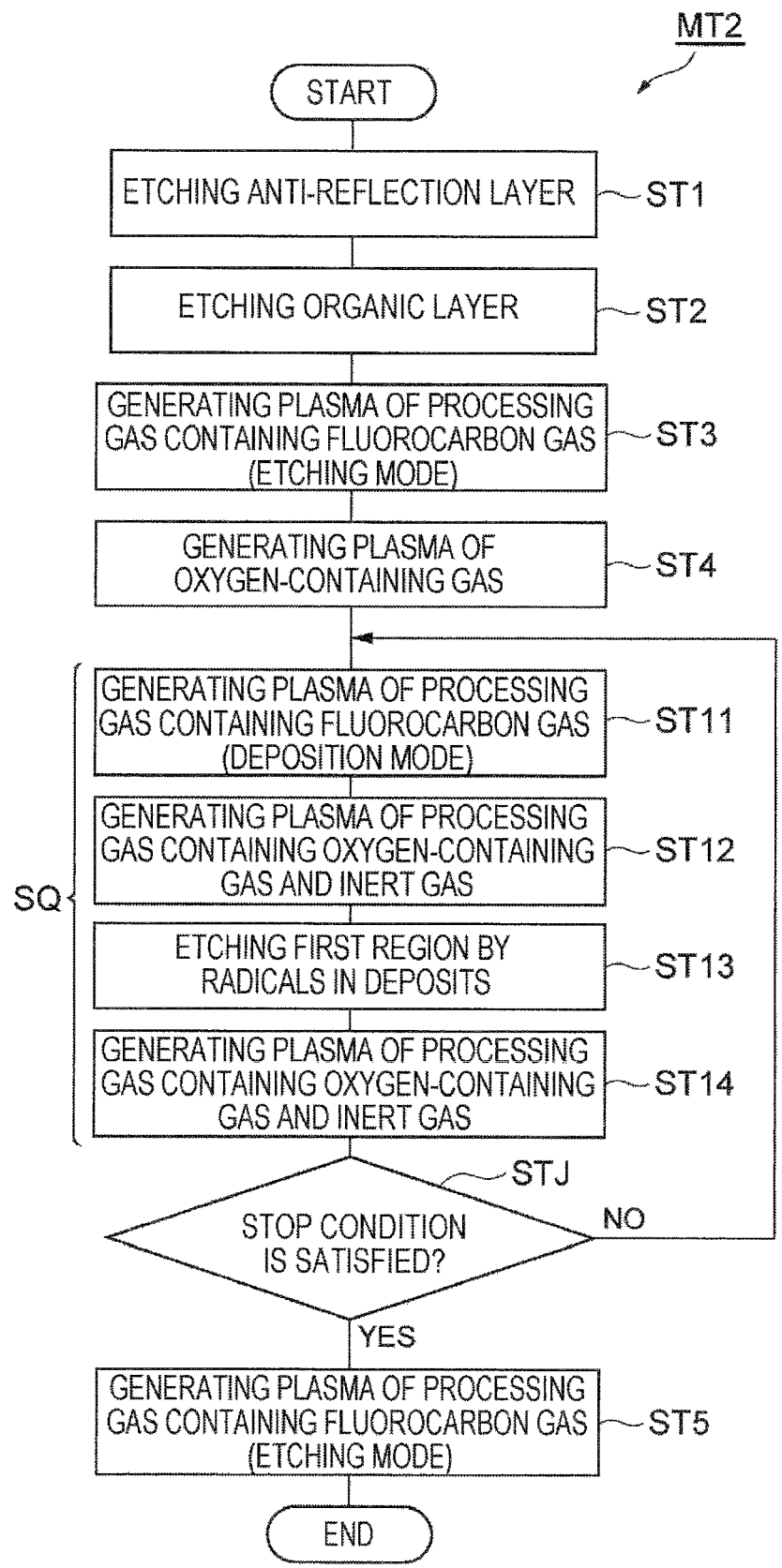
FIG. 12 is a flow chart illustrating an etching method according to another exemplary embodiment.
Figure 13:
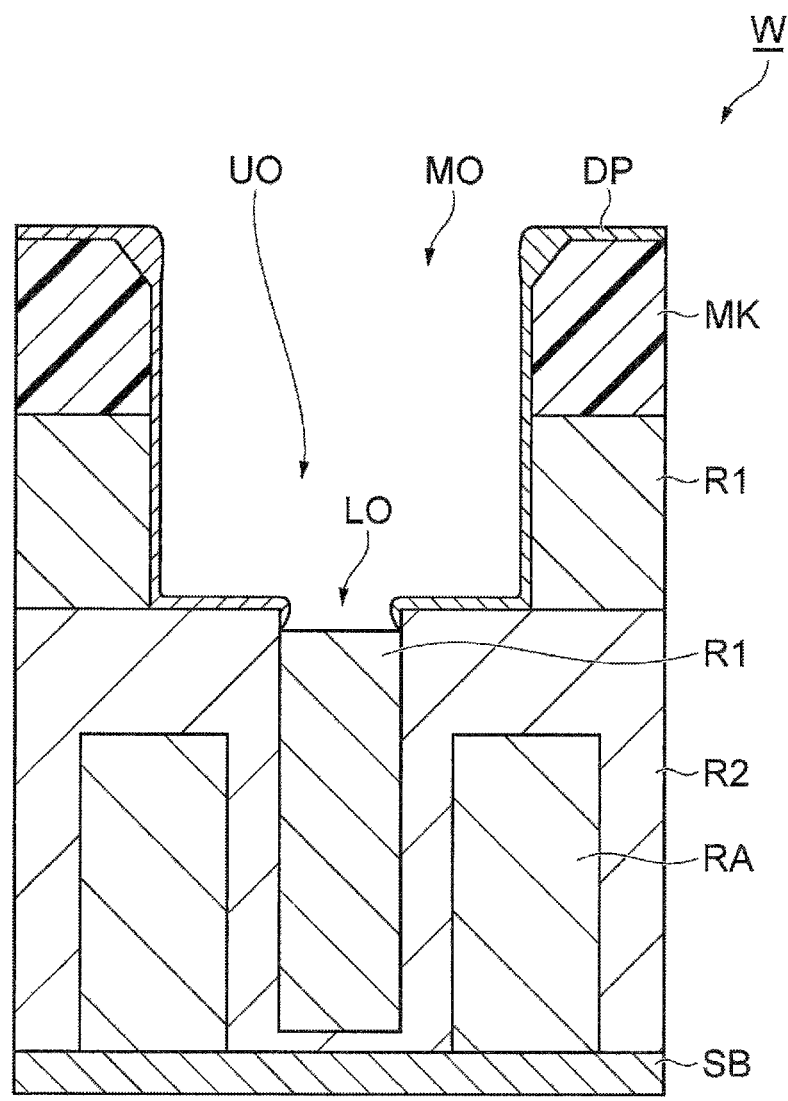
FIG. 13 is a sectional view illustrating the workpiece after a step ST14 of the method illustrated in FIG. 12 is performed.

Hereinafter, an etching method according to another exemplary embodiment will be described. FIG. 12 is a flow chart illustrating an etching method according to another exemplary embodiment. FIG. 13 is a sectional view illustrating the workpiece after step ST14 of the method illustrated in FIG. 12 is performed. The method MT2 illustrated in FIG. 12 is different from the method MT in that the sequence SQ further includes step ST14 performed after step ST13 is performed. Step ST14 is the same step as step ST12. As conditions for processing in step ST14, the conditions described in the processing in step ST12 may be employed.

As described above, in step ST13, ions are drawn into the wafer W. Accordingly, substances constituting the deposits DP are released from the wafer W, and the substances are attached again to the wafer W so that, as illustrated in FIG. 10, the deposits DP are formed to narrow the width of the opening MO and the lower opening LO. The deposits DP, in some cases, may clog the opening MO and the lower opening LO. In the method MT2, when step ST14 is performed, the wafer W illustrated in FIG. 10 is exposed to active species of oxygen in the same manner as in step ST12. Accordingly, as illustrated in FIG. 13, the deposits DP which narrow the width of the opening MO and the lower opening LO may be reduced so that the opening MO and the lower opening LO may be more reliably prevented from being clogged.

As described above, various exemplary embodiments have been described, but various modifications may be configured without being limited to the exemplary embodiments described above. For example, in the execution of the method MT and the method MT2, a high frequency power for generating plasma is supplied to the lower electrode LE, but the high frequency power may be supplied to the upper electrode 30. Also, in the execution of the method MT and the method MT2, a plasma processing apparatus other than the plasma processing apparatus 10 may be used. Specifically, the method MT and the method MT2 may be carried out using any plasma processing apparatus such as an inductively coupled plasma processing apparatus or a plasma processing apparatus for generating the plasma using surface waves such as microwaves.

In the sequence SQ of the method MT, the execution order of steps ST11, ST12, and ST13 may be changed. For example, in the sequence SQ of the method MT, after step ST13 is performed, step ST12 may be performed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching method comprising:
   (a) providing a workpiece including a first region made of a first material and a second region made of a second material defining a recess, the first region filling the recess of the second region while covering the second region;
   (b) generating plasma of a first fluorocarbon gas to etch the first region until before exposing the second region;
   (c) generating plasma of a second fluorocarbon gas to form fluorocarbon deposits on the first region;
   (d) generating plasma of a processing gas containing only an inert gas to etch the first region by fluorocarbon radicals contained in the fluorocarbon deposits; and
   (e) repeating step (c) and step (d) one or more times until after exposing the second region,
   wherein during a sequence of steps (c) through (e), the first region is selectively etched with respect to the second region,
   wherein a material of the fluorocarbon deposits is different from a material of the first region.

2. The etching method according to claim 1, wherein the first material includes $SiO_2$, and the second material includes SiN.

3. The etching method according to claim 1, further comprising:
   (f) generating plasma of a third fluorocarbon gas to etch the first region after step (e).

4. The etching method according to claim 3, wherein an etching rate of the etching the first region by the plasma of the third fluorocarbon gas in step (f) is higher than an etching rate of the etching the first region during the sequence of steps (c) through (e).

5. The etching method according to claim 3, wherein the generating plasma of the third fluorocarbon gas of step (f) continuously etches the first region in the recess to a bottom of the recess.

6. The etching method according to claim 3, wherein, in the generating plasma of the third fluorocarbon gas of step (f), a negative voltage is applied to an upper electrode which faces the workpiece.

7. The etching method according to claim 3, wherein a high frequency bias power in the generating plasma of the third fluorocarbon gas is higher than a high frequency bias power in the generating the plasma of the second fluorocarbon gas of step (c).

8. The etching method according to claim 1, wherein the first fluorocarbon gas is different from the second fluorocarbon gas in a ratio of a number of fluorine atoms to a number of carbon atoms.

9. The etching method according to claim 8, wherein the ratio of the number of fluorine atoms to the number of carbon atoms is higher in the first fluorocarbon gas than in the second fluorocarbon gas.

10. The etching method according to claim 1, wherein the workpiece includes a mask formed on the first region providing an opening having a width wider than a width of the recess formed in the second region.

11. The etching method according to claim 1, wherein the first fluorocarbon gas includes at least one of a $CF_4$ gas, and a $C_4F_8$ gas, and
   wherein the second fluorocarbon gas includes a $C_4F_6$ gas.

12. The etching method according to claim 1, wherein, in the generating plasma of the processing gas containing only the inert gas of step (d), a high frequency power for generating plasma and a high frequency bias power are applied to a lower electrode that supports the workpiece.

13. The etching method according to claim 12, wherein the high frequency power ranges from 100 W to 500 W.

14. The etching method according to claim 12, wherein the high frequency bias power ranges from 20 W to 300 W.

15. The etching method according to claim 1, wherein, in the generating plasma of the processing gas containing only the inert gas of step (d), a flow rate of the inert gas ranges from 500 sccm to 1500 sccm.

16. The etching method according to claim 1, further comprising:
   (h) generating plasma of an oxygen-containing gas between the generating plasma of the first fluorocarbon gas of step (b) and the generating plasma of the second fluorocarbon gas of step (c).

17. The etching method according to claim 1, wherein the material of the first region is silicon oxide.

18. An etching method comprising:
   (a) providing a workpiece including a first region made of a first material and a second region made of a second material defining a recess, the first region filling the recess of the second region while covering the second region;
   (b) generating plasma of a first fluorocarbon gas to etch the first region until before exposing the second region;
   (c) generating plasma of a second fluorocarbon gas to form fluorocarbon deposits on the first region;
   (d) generating plasma of a processing gas containing only an inert gas to etch the first region by fluorocarbon radicals contained in the fluorocarbon deposits; and
   (e) repeating step (c) and step (d) one or more times until after exposing the second region,
   wherein during a sequence of steps (c) through (e), the first region is selectively etched with respect to the second region;
   the method further comprising:
   (f) generating plasma of an oxygen-containing gas, that does not contain a fluorocarbon gas, and an inert gas either in between the generating plasma of the second fluorocarbon gas of step (c) and the generating plasma of the processing gas containing only the inert gas of step (d), or after the generating plasma of the processing gas containing only the inert gas of step (d),
   wherein a material of the fluorocarbon deposits is different from a material of the first region.

19. The etching method according to claim 18, wherein the generating plasma of the oxygen-containing gas and the inert gas of step (f) is performed for at least 2 seconds between the generating plasma of the second fluorocarbon gas of step (c) and the generating plasma of the processing gas containing only the inert gas of step (d).

20. An etching method comprising:
(a) providing a workpiece including a first region and a second region defining a recess therein, the first region filling the recess of the second region while covering the second region;
(b) generating plasma of a first fluorocarbon gas to etch the first region until before exposing the second region;
(c) generating plasma of a second fluorocarbon gas to form fluorocarbon deposits on the first region;
(d) generating plasma of a processing gas containing only an inert gas to etch the first region by fluorocarbon radicals contained in the fluorocarbon deposits; and
(e) repeating step (c) and step (d) one or more times until after exposing the second region,
wherein the first fluorocarbon gas is different from the second fluorocarbon gas, and
the first region is made of a first material that is etched by the fluorocarbon deposits and the second region is made of a second material different from the first material, and the second region is protected by the fluorocarbon deposits,
wherein a material of the fluorocarbon deposits is different from a material of the first region.

21. The etching method according to claim 20, wherein the material of the first region is silicon oxide.

* * * * *